United States Patent [19]

Ogashiwa

[11] Patent Number: 5,514,334
[45] Date of Patent: May 7, 1996

[54] FINE LEAD ALLOY WIRE FOR FORMING BUMP ELECTRODES

[75] Inventor: Toshinori Ogashiwa, Tokyo, Japan

[73] Assignee: Tanaka Denshi Kogyo Kabushiki Kaisha, Tokyo, Japan

[*] Notice: The term of this patent shall not extend beyond the expiration date of Pat. No. 5,384,090.

[21] Appl. No.: 315,575

[22] Filed: Sep. 30, 1994

Related U.S. Application Data

[63] Continuation of Ser. No. 970,232, Oct. 30, 1992, Pat. No. 5,384,090, which is a continuation of Ser. No. 139,808, Dec. 30, 1987, abandoned.

[30] Foreign Application Priority Data

Jan. 30, 1987 [JP] Japan .................................. 62-21202
May 27, 1987 [JP] Japan ................................ 62-130595
Jul. 31, 1987 [JP] Japan ................................ 62-193340

[51] Int. Cl.⁶ .......................... C22C 11/04; C22C 11/06; C22C 11/10; C22C 11/08
[52] U.S. Cl. .......................... 420/571; 420/570; 420/566; 420/563; 420/580; 420/587; 420/588; 420/589
[58] Field of Search ..................... 420/563, 564, 565, 566, 570, 571, 572, 573, 574, 575, 580, 589, 587, 588; 428/606

[56] References Cited

U.S. PATENT DOCUMENTS

| | | |
|---|---|---|
| 2,306,676 | 12/1942 | Tuckus . |
| 2,623,273 | 12/1952 | Murray et al. . |
| 3,607,252 | 9/1971 | North . |
| 3,716,909 | 2/1973 | Stokes et al. . |
| 3,833,362 | 9/1974 | Postupack . |
| 3,945,556 | 3/1976 | Manko . |
| 4,070,192 | 1/1978 | Arbib et al. . |
| 4,331,739 | 5/1982 | Narasimhan . |
| 4,504,849 | 3/1985 | Davies et al. . |
| 4,654,275 | 3/1987 | Bose et al. . |

FOREIGN PATENT DOCUMENTS

| | | |
|---|---|---|
| 2093 | 1/1970 | Japan . |
| 17643 | 9/1972 | Japan . |
| 53-86572 | 7/1978 | Japan . |
| 1254 | 1/1979 | Japan . |
| 18505 | 2/1980 | Japan . |
| 161355 | 9/1983 | Japan . |
| 153857 | 9/1984 | Japan . |
| 59-208751 | 11/1984 | Japan . |
| 61-43438 | 3/1986 | Japan . |
| 61-219159 | 9/1986 | Japan . |
| 222140 | 10/1986 | Japan . |
| 63-168036 | 7/1988 | Japan . |
| 63-168031 | 7/1988 | Japan . |
| 4174527 | 6/1992 | Japan . |

OTHER PUBLICATIONS

English Language Abstract of Japanese Patent Document No. 63–168031.
English Language Abstract of Japanese Patent Document No. 63–168036.
English Language Abstract of Japanese Patent Document No. 4–174527.
English Language Abstract of Japanese Patent Document No. 53–86572.

Primary Examiner—Deborah Yee
Attorney, Agent, or Firm—Greenblum & Bernstein

[57] ABSTRACT

This invention relates to a connection method for a semiconductor material enabling a formation of a bump electrode with a wire bonder, keeping always a cutting position of the wire at a specified position and improving a continuous workability and stability and to a connection material to be used in the connecting method, wherein any one of Pb, Sn, In is applied as a major element and the alloy having additive elements mixed with it is made as a fine wire under a rapid cooling and condensation process and further to a semiconductor device made by the above-mentioned connecting method.

14 Claims, 2 Drawing Sheets

FINE LEAD ALLOY WIRE FOR FORMING BUMP ELECTRODES

This application is a continuation of application No. 07/970,232, filed Oct. 30, 1992, now U.S. Pat. No. 5,384, 090 which is a continuation of application Ser. No. 07/139, 808, filed Dec. 30, 1987, now abandoned.

BACKGROUND OF THE INVENTION

1. Field of the Invention

This invention relates to a method for connecting semiconductor material, and more particularly a connecting method applied when a wireless bonding method, in particular a flip chip bonding method or a tape carrier bonding method are applied for bonding semiconductor tips to a substrate, such as a connection material to be used in the connection method and semiconductor devices manufactured by the above-mentioned connection method.

2. Description of the Prior Art

As the conventional system for forming a bump electrode by using a wire bonding machine, two Japanese publications are relevant, they are; Japanese Patent Publication Nos.61-43438 and 61-219159. In the prior art, after the bump electrode is bonded, the desired position of the wire is cut by an electrical discharge with an electric torch in order to make a specified size of the wire remaining in the ball.

The above-mentioned prior art a involves a complicated processing step and has decreased work efficiency.

Other connecting methods, are disclosed in Japanese Patent Publication No. 59-208751, wherein the wire is clamped with a clamper after the bonding operation and cut while being pulled up, i.e. a connecting method requiring no special cutting method is disclosed. However, as described in this publication, although a mere clamping and pulling up of the wire with a clamper enables the wire to be cut, it is impossible to keep the size of the wire remaining in the ball always constant, to perform a continuous stable bonding operation and to provide a semiconductor device having high reliability.

At present, as a bump electrode material, PbSn of 5 wt %, PbSn of 40 wt % or the like is used. However, it has been found that a connection of alloy wire made by drawing the alloy manufactured by a normal casting method through a die using a wire bonder operation requires frequent cutting of the wire not at the root part of the ball but at a midway part of the wire. This cause a substantial variation in its length and as such the wire is not suitable as a bump electrode.

Cutting of the alloy wire at the wire part is caused by the fact that a tensile strength of the root part of the ball is not sufficiently low as compared with a tensile strength of the wire part.

Due to this reason, the conventional method described in Japanese Patent Publication No.59-208751 can not always keep the size of wire remained in the ball constant.

SUMMARY OF THE INVENTION

It is an object of the present invention to provide a connection method for semiconductor material and a connection material to be used in the connection method in which a bump electrode can be formed by using a wire bonder. The method is performed in a way such that the cutting position of the wire is always kept constant and a continuously workable and stable bonding operation are performed.

Another object of the present invention is to provide a less expensive semiconductor device having a high reliability which is manufactured by the above-mentioned connecting method.

A connecting method of the present invention as described above is characterized in that any one of Pb, Sn and In is applied as a major element. An end of a fine alloy wire, manufactured by a rapid cooling and condensation method, is heated to form a ball part. The alloy metal is then tensioned while the ball is adhered to the upper surface of a line or the upper surface of a semiconductor material. The ball is then cut at its root part to form a bump electrode on the upper surface of the line or the upper surface of the semiconductor material and the semiconductor material is connected through the bump electrode.

The connection material of the present invention is characterized in that any one of Pb, Sn and In is applied as a major element and an alloy having an additional element added to the major element is made as a fine wire through a rapid cooling and condensation method.

The semiconductor device of the present invention is characterized in that a semiconductor material in a main body of the semiconductor device is electrically connected to a lead wire through a bump electrode supplied from a fine alloy wire manufactured through a rapid cooling and condensation method. According to the present invention, the alloy wire made by a rapid cooling and condensation method shows a remarkable high tensile strength through structure introducing many defected grids, making fine crystal particles, generating a non-balanced phase, and showing a forced solid solution between elements.

As discussed above, when the extremity end of the alloy wire is heated to form a ball, the non-balanced phase is diminished at a root part of the ball. The forced solid solution formed between the elements is released, whereby the defected grids are released and the crystal particles are increased in their size to decrease a tensile strength of the root part of the ball. This may cause breakage at that portion being treated.

In view of the foregoing, the ball is cut off from the root part by pulling the wire. The bump electrode is then formed on the upper surface of the semiconductor material or the upper surface of the line from the ball cut from the wire. Thus, according to the present invention, since the ball is supplied from the alloy wire by using a wire bonder and the bump electrode can be formed, a cutting step between the wire and the ball by using an electrical torch is eliminated to simplify the working step. At the same time, a ball cutting position is provided whereby the accuracy of bump supplying position is improved due to the wire bonder so as to improve reliability of the product. Further by using on alloy wire made of soldering material having as its major element Pb, Sn and In, this eliminates the need for other connecting materials causing reduced workability and cost of the product.

DESCRIPTION OF THE PREFERRED EMBODIMENTS

Figure 11:
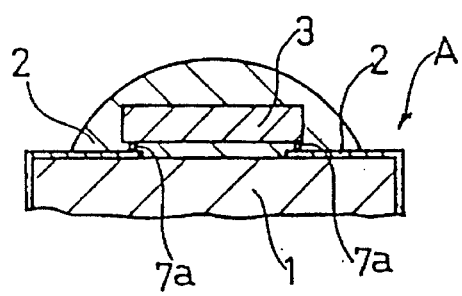
FIG. 11 is a sectional view for showing a semiconductor device of the preferred embodiment (I).

FIGS. 1 to 5 and FIG. 11 illustrate one preferred embodiment of the present invention, wherein a semiconductor device (A) to be used in the preferred embodiment is, as shown in FIG. 11, as a so-called flip chip bonding type. A substrate (1) is formed by an alumina or insulating resin such as glass epoxy resin or the like. The upper surface of the substrate (1) is provided with a wiring (2) comprised of electrical conductive° material such as Cu or Cr.Cu or Pt or Pd or Ag or Pd.Ag or Au or Al or Ni or the like. At the same time a central part of the substrate (1) is provided with a chip (3) acting as a semiconductor material which is electrically connected with wiring (2) through bump electrodes (7a).

The semiconductor chip (3) and a part of wiring (2) are sealed by a protective resin such as silicon or the like. FIGS. 1 to 5 are a sectional view for showing a connecting method of the present invention for a semiconductor material in the semiconductor device (A).

Figure 1:
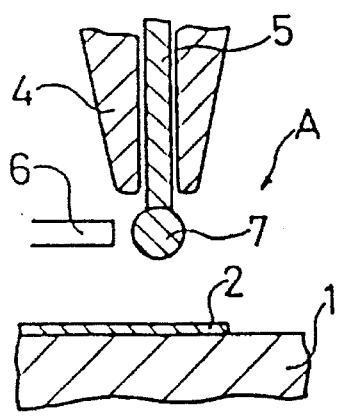
FIGS. 1 to 5 are a sectional view for illustrating a connecting method for a semiconductor material with a flip chip bonding method (preferred embodiment I) and a connecting material to be used in the connecting method.

FIG. 1 illustrates an alloy wire (5) acting as a connection material which is inserted into a capillary tube (4) of a wire bonder and an extremity end of the alloy wire is heated by an electrical torch (6) to form a ball (7). The alloy wire (5) is an alloy in which any one of soldering materials such as Pb, Sn and In is applied as a major element and elements additional are mixed with it; further this is a fine wire made under a rapid cooling and condensation method. That is, as the rapid cooling and condensation method, a wire is directly formed through a so-called liquid spinning method or an alloy material passed through a single rolling method which is cold pressed and pushed to form a wire. The alloy wire (5) is made by drawing the wire so as to make the desired fine wire diameter.

As additional elements for inclusion in the alloy wire (5), may include at least one element Be, B, C, Mg, Al, Si, P, Ca, Ti, V, Cr, Mn, Fe, Co, Ni, Cu, Zn, Ga, Ge,Se,Zr, Nb, Mo, Pd, Ag, Cd, Sb, Te, Ir, Pt, Au, Tl and Bi. These are mixed to each other and the major elements, such as Pb, Sn and In they may be added to the major element not containing these elements.

Preferred alloy materials include the following:

1) alloy material is comprised of Sn of 10 wt %, Cu of 0.9 wt % and a balance of Pb.

2) alloy material is comprised of Pb-Ag-Cu with Ag of 3 wt %, Cu of 0.9 wt % and a balance of Pb.

3) alloy material is comprised of Pb-Sn-Ag-Cu with Sn of 0.3 to 50 wt %, Ag of 0.5 to 10 wt %, Cu of 0.1 to 0.9 wt % and a balance of Pb.

4) alloy material is comprised of Pb-Sn-Ag-Cu with Sn of 0.3 to 5 wt %, Ag of 0.5 to 5 wt %, Cu of 0.1 to 0.9 wt % and a balance of Pb.

5) alloy material is comprised of Pb-Sn-Cr-Cu with Sn of 0.5 to 2 wt %, Cr of 3 wt %, Cu of 0.9 wt % and a balance of Pb.

6) alloy material is comprised of Pb-Sn-Ag-Ni with Sn of 0.5 to 5 wt %, Ag of 2 to 5 wt %, Ni of 0.1 to 5 wt % and a balance of Pb.

7) alloy material is comprised of Pb-Sn-Sb with Sn of 1 to 50 wt %, Sb of 1 to 8 wt %, Ag of 2 to 10 wt % and a balance of Pb.

8) alloy material is comprised of Pb-Sn-Sb-Ag with Sn of 1 to 50 wt %, Sb of 1 to 8 wt %, Ag of 2 to 10 wt % and a balance of Pb.

9) alloy material is comprised of Pb-Sn-Sb-Ag with Sn of 1 to 5 wt %, Sb of 1 to 8 wt %, Ag of 2 to 5 wt % and a balance of Pb.

10) alloy material is comprised of Pb-Sn-Ag-Cu-Sb with Sn of 1 to 50 wt %, Ag of 2 to 10 wt %, Cu of 0.1 to 0.9 wt %, Sb of 1 to 8 wt % and a balance of Pb.

11) alloy material is comprised of Pb-Sn-Ag-Cu-Sb with Sn of 1 to 5 wt %, Ag of 2 to 5 wt %, Cu of 0.1 to 0.9 wt %, Sb of 1 to 8 wt % and a balance of Pb.

12) alloy material is comprised of Pb-In-Au of 5 to 50 wt %, Au of 0.1 to 5 wt % and a balance of Pb.

13) alloy material is comprised of Pb-In-Ag with In of 5 to 50 wt %, Ag of 0.1 to 5 wt % and a balance of Pb.

14) alloy material is comprised of Pb-In-Ag with In of 5 to 50 wt %, Ag of 0.1 to 5 wt % and a balance of Pb.

15) alloy material is comprised of Pb-In-Cu with In of 5 to 50 wt %, Cu of 0.1 to 5 wt % and a balance of Pb.

16) alloy material is comprised of Sn-Sb-Au-Ag with Sb of 1 to 3 wt %, Au of 1 wt %, AG of 3 wt % and a balance of Sn.

17) alloy material is comprised of Sn-Pb-Au-Ag with Pb of 1 to 3 wt %, Au of 1 wt %, Ag of 3 wt % and a balance of Sn.

18) alloy material is comprised of Sn-Sb-Pb with Sb of 1 to 8 wt % , Pb of 35 to 50 wt % and a balance of Sn.

19) alloy material is comprised of Sn-Sb-Pb-Ag with Sb of 1 to 8 wt %, Pb of 35 to 50 wt %, Ag of 2 to 10 wt % and a balance of Sn.

20) alloy material is comprised of Sn-Sb-Pb-Ag-Cu with Sb of 1 to 8 wt %, Pb of 35 to 50 wt %, Ag of 2 to 10 wt %, Cu of 0.1 to 0.9 wt % and a balance of Sn.

21) alloy material is comprised of Sn-Pb-Ag-Cu with Pb of 35 to 50 wt %, Ag of 0.5 to 10 wt %, Cu of 0.1 to 0.9 wt % and a balance of Sn.

22) alloy material is comprised of In-Sn-Au-Ag with Sn of 1 to 2 wt %, Au of 1 wt %, Ag of 2 wt % and a balance of In.

23) alloy material of Pb-Sn-Au-Sb-Cu is comprised of sn of 2 to 50 wt %, Au of 0.001 to 0.5 wt %, Sb of 0.01 to 5 wt %, Cu of 0.01 to 1.5 wt % and a balance of Pb.

24) alloy material of Sn-Pb-Au-Sb-Cu is comprised of Pb of 40 to 50 wt %, Au of 0.001 to 0.5 wt %, Sb of 0.01 to 5 wt %, Cu of 0.01 to 1.5 wt % and a balance of Sn.

The alloy wire (5) shows a structural state under the above-mentioned rapid cooling process; in which grid defects are generated therein, crystal particles are made fine particles, a non-balanced phase is generated and a forced solid solution between the elements to each other is obtained further, the alloy wire shows another structural state under the wire drawing work in which grid defects are made as a machine hardening is generated and a solid solution, harden state, is made by the additional elements.

Figure 2:
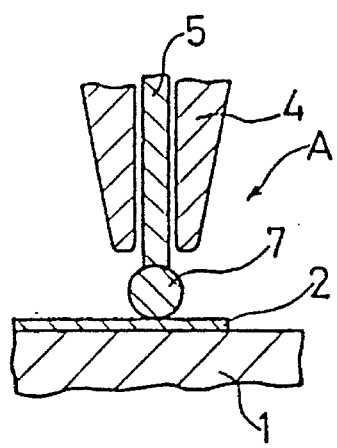
Figure 3:
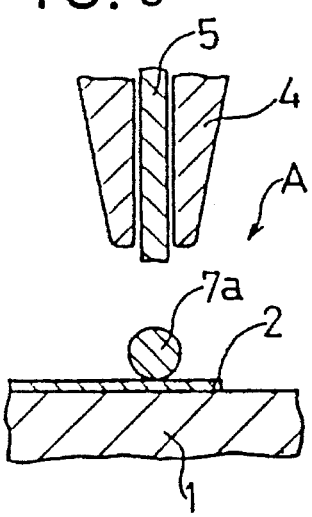

As shown in FIGS. 2 and 3, capillary tube (4) is pulled up while ball (7) is formed at the extremity end of alloy wire (5) which is attached to the wiring (2) by descending capillary tube (4). When ball (7) is cut at its root part from alloy wire (5), the ball (7) is supplied onto the wiring (2) so as to form a bump electrode (7a).

The bump electrode (7a) can be continuously formed on an entire wiring (2) on the upper surface of the substrate (1) with such a method as described herein.

The cutting step of alloy wire (5) is performed in such a way so that the above-mentioned non-balanced phase is diminished at the root part of ball (7). When the ball (7) is heated and formed, a forced solid solution between the elements is released, grid defects are released, and the crystal particles show roughly enlarged structural state, so that the tensile strength at that portion is decreased. A mere pulling-up of the alloy wire (5 ) through the capillary tube (4 ) causes the ball (7) to be stressed and broken at its root part.

Figure 4:
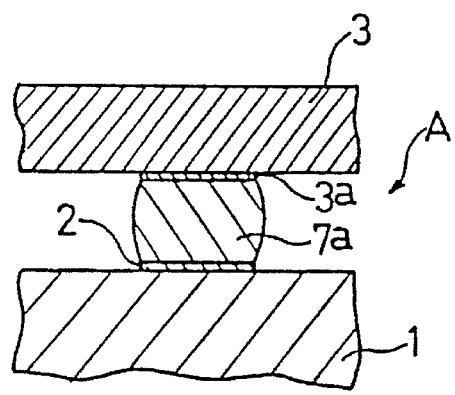

As shown in FIG. 4, bump electrodes (7a) are supplied and adhered to the upper surfaces of wires (2) are adhered to electrodes (3a) arranged at the surface of the semiconductor chip (3). The wires (2) and the electrodes (3a) are electrically connected to each other and at the same time the semiconductor chip (3) is fixed to it.

Figure 5:
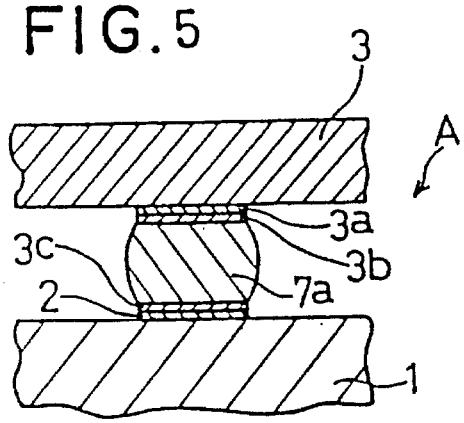

As shown in FIG. 5, in order to make a mechanical rigid coupling having a low electrical resistance between the wires (2) and the bump electrodes (7a) or between the bump electrodes (7a) and the electrodes (3a) at the surface of the semiconductor chip, ground metallic layers (3b, 3c) are formed by standard vapor depositing process, sputtering process a plating process or the like. For example, if the electrode (3a) material of the semiconductor chip is Al, a single layer or piled layer surface having Cr or Ti or Cu or Ni or Pd or Ag or Pt or Au or the like is formed on the ground metallic layer (3b). In a preferred embodiment, ball (7) is adhered onto the wires (2) in order to form the bump electrodes (7a) on the wires (2), It is also possible to adhere ball (7) onto electrode (3a) in order to form the bump electrode (7a) on the electrode (3a) of the semiconductor chip (7a).

Figure 12:
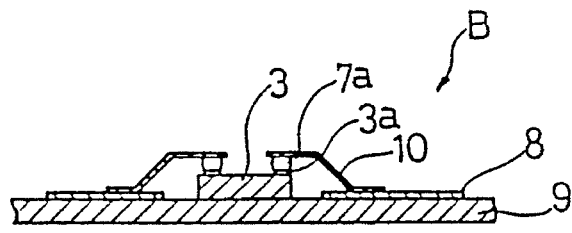
FIG. 12 is a sectional view for showing a semiconductor device of the preferred embodiment II.

FIGS. 6 to 10 and FIG. 12 illustrate another preferred embodiment of the present invention, wherein a semiconductor device (B) to be used in the preferred embodiment is a so-called tape carrier bonding type as shown in FIG. 12. A bump electrode (7a) is formed on the electrode (3a) of chip (3) acting as the semiconductor material, a film lead (10) is connected to the bump electrode, and wire (8) on the substrate (9) and film lead (10) are connected to each other.

FIGS. 6 to 10 are a sectional view for showing a connecting method for a semiconductor material according to the present invention in the semiconductor device (B).

Figure 6:
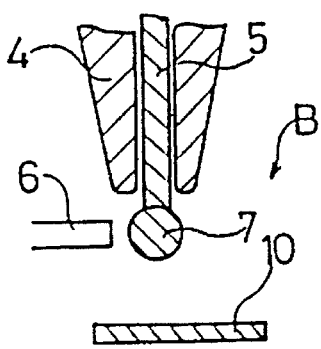
FIGS. 6 to 10 are a sectional view for illustrating a connecting method for semiconductor material through a tape carrier bonding method (preferred embodiment II) and the connecting material to be used in the connecting method.

FIG. 6 shows the same step as found in the previous preferred embodiment, wherein an alloy wire (5) acting as a connection material to be inserted into the capillary tube (4) of wire bonder is shown and the extremity end of the alloy wire is heated by an electrical torch (6) to form the ball (7). The alloy wire (5) is made of the same connection material as that of the previous preferred embodiment and for the sake of clarity in description, its description is eliminated.

Figure 7:
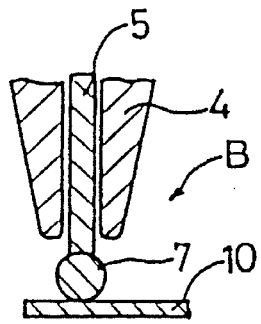
Figure 8:
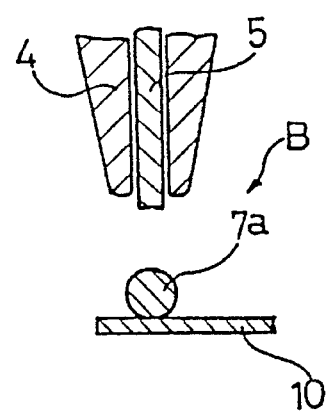

As shown in FIGS. 7 and 8, the capillary tube (4) is descended and then the capillary tube (4) is pulled up while the ball (7) formed at the extremity end of the alloy wire (5) is attached to the film lead (10). The ball (7) is then cut at its root part from the alloy wire (5) wherein the ball (7) is supplied onto the film lead (10) so as to form the bump electrode (7a).

In such a method as above, the bump electrode (7a) is continuously formed in an entire film lead (10) and the cutting of the alloy wire (5) is performed in the same manner as that of the previous preferred embodiment in which a mere pulling-up of the alloy wire (5) with the capillary tube (4) causes the ball (7) to be cut at its root part.

Figure 9:
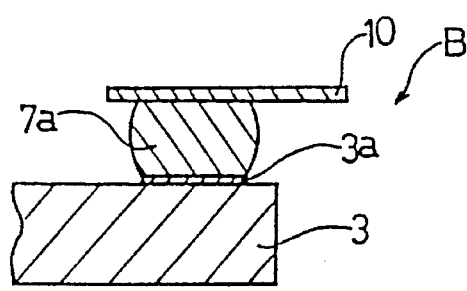

As shown in FIG. 9, the bump electrode (7a) supplied and adhered onto the upper surface of the film lead (10) is adhered to the electrode (3a) and arranged on the surface of the semiconductor chip (3), thereby the film lead (10) and the electrode (3a) are electrically connected to each other and at the same time the semiconductor chip (3) is fixed.

Figure 10:
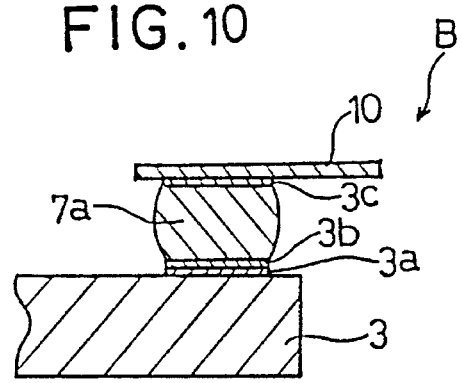

As shown in FIG. 10, in order to make an electrical low resistant and mechanical rigid connection between the film lead (10) and the bump electrode (7a) or the bump electrode (7a) and the electrode (3a) at the surface of the semiconductor chip, the ground metallic layers (3b, 3c) which may easily form the alloy with these materials are formed with a vapor depositing method, sputtering method a plating method, or the like. In the preferred embodiment, in order to form the bump electrode (7a) on the film lead (10), the ball (7) is adhered onto the film lead (10) and in turn it is also possible to adhere the ball (7) onto the electrode (3a) in order to form the bump electrode (7a) on the electrode (3a) of the semiconductor tip (3).

Preferred features of the present invention will now be described together with a comparison product made by the conventional manufacturing method.

A cooling speed of the alloy wire according to the present invention at its rapid cooling and condensation time is $10^{3\circ}$ to $10^{5\circ}$ C./sec and both the worked product of the present invention and the wire of the comparison product had a wire diameter of 60 um$^\phi$, respectively The workability in the above-mentioned characteristics of the test piece was compared by the following two steps, namely whether an elongation work can be performed or not without heat treatment up to 60 um$^\phi$. That is, an evaluation with a circle mark shows a workability and another evaluation with a x-mark shows a certain problem in workability such as a frequent cutting of the wire or the like.

The ball forming capability evaluates the ball forming circumstance with the following two steps in which each of the test pieces is passed through a capillary tube of ceramics. The ball is formed under an arc discharge between the electrode arranged near the extremity end of the test piece and the test piece under injection of gas added with hydrogen gas of 5 vol % to argon gas. That is, the evaluation with a circle mark shows a formation of ball having a superior degree of sphere and a smooth surface and an evaluation with a x-mark shows a ball having a poor degree of sphere, a high degree of disturbance and a poor surface shape. Results are set forth in the following Table.

TABLE

| Kind of Test Piece (wt. %) | Worked Product of the Present Invention | | | | | |
|---|---|---|---|---|---|---|
| | Workability | Ball Forming Characteristic | Tensile Strength (kg/mm$^2$) | Elongation (%) | Ball Hardness (Hv) | Cutting at the Root of Ball |
| PbSn$^{10}$Cu$^{0.9}$ | ○ | ○ | 3.4 | 28 | 10 | Available |
| PbAg$^3$Cu$^{0.9}$ | ○ | ○ | 10.9 | 1.5 | 9 | Available |
| PbSn$^{0.3}$Ag$^3$Cu$^{0.9}$ | ○ | ○ | 9.8 | 1.7 | 9 | Available |
| PbSn$^{0.5}$Ag$^3$Cu$^{0.9}$ | ○ | ○ | 9.0 | 2.0 | 9 | Available |
| PbSn$^{0.7}$Ag$^3$Cu$^{0.9}$ | ○ | ○ | 8.5 | 2.2 | 9 | Available |
| PbSn$^1$Ag$^3$Cu$^{0.9}$ | ○ | ○ | 7.3 | 2.5 | 9 | Available |
| PbSn$^2$Ag$^3$Cu$^{0.9}$ | ○ | ○ | 5.6 | 3.0 | 9 | Available |
| PbSn$^5$Ag$^3$Cu$^{0.9}$ | ○ | ○ | 4.9 | 7.5 | 10 | Available |
| PbSn$^{0.5}$Ag$^{0.5}$Cu$^{0.9}$ | ○ | ○ | 5.0 | 1.5 | 9 | Available |
| PbSn$^{0.5}$Ag$^1$Cu$^{0.9}$ | ○ | ○ | 6.3 | 1.0 | 9 | Available |
| PbSn$^{0.5}$Ag$^2$Cu$^{0.9}$ | ○ | ○ | 7.5 | 1.3 | 9 | Available |
| PbSn$^{0.5}$Ag$^4$Cu$^{0.9}$ | ○ | ○ | 8.5 | 1.8 | 9 | Available |

TABLE-continued

| | | | | | | |
|---|---|---|---|---|---|---|
| PbSn$^{0.5}$Ag$^5$Cu$^{0.9}$ | ○ | ○ | 8.0 | 3.5 | 10 | Available |
| PbSn$^1$Ag$^{0.5}$Cu$^{0.9}$ | ○ | ○ | 4.0 | 1.8 | 9 | Available |
| PbSn$^1$Ag$^1$Cu$^{0.9}$ | ○ | ○ | 5.1 | 1.3 | 9 | Available |
| PbSn$^1$Ag$^2$Cu$^{0.9}$ | ○ | ○ | 7.0 | 1.6 | 9 | Available |
| PbSn$^1$Ag$^4$Cu$^{0.9}$ | ○ | ○ | 7.5 | 2.1 | 9 | Available |
| PbSn$^1$Ag$^5$Cu$^{0.9}$ | ○ | ○ | 7.3 | 3.9 | 10 | Available |
| PbSn$^{0.5}$Ag$^3$Cu$^{0.1}$ | ○ | ○ | 12.5 | 1.5 | 9 | Available |
| PbSn$^{0.5}$Ag$^3$Cu$^{0.2}$ | ○ | ○ | 9.5 | 0.8 | 9 | Available |
| PbSn$^{0.5}$Ag$^3$Cu$^{0.4}$ | ○ | ○ | 8.5 | 1.5 | 9 | Available |
| PbSn$^1$Ag$^3$Cu$^{0.1}$ | ○ | ○ | 11.5 | 1.7 | 9 | Available |
| PbSn$^1$Ag$^3$Cu$^{0.2}$ | ○ | ○ | 9.0 | 1.0 | 9 | Available |
| PbSn$^1$Ag$^3$Cu$^{0.4}$ | ○ | ○ | 8.0 | 1.8 | 9 | Available |
| PbSn$^{0.5}$Cr$^3$Cu$^{0.9}$ | ○ | ○ | 9.9 | 1.6 | 9 | Available |
| PbSn$^{0.7}$Cr$^3$Cu$^{0.9}$ | ○ | ○ | 9.7 | 1.8 | 9 | Available |
| PbSn$^1$Cr$^3$Cu$^{0.9}$ | ○ | ○ | 9.1 | 2.0 | 9 | Available |
| PbSn$^2$Cr$^3$Cu$^{0.9}$ | ○ | ○ | 8.7 | 2.5 | 9 | Available |
| PbSn$^{0.5}$Ag$^3$Ni$^{0.1}$ | ○ | ○ | 13.0 | 1.5 | 9 | Available |
| PbSn$^{0.5}$Ag$^3$Ni$^{0.5}$ | ○ | ○ | 7.0 | 1.6 | 9 | Available |
| PbSn$^{0.5}$Ag$^3$Ni$^1$ | ○ | ○ | 6.5 | 1.7 | 9 | Available |
| PbSn$^{0.5}$Ag$^3$Ni$^2$ | ○ | ○ | 6.4 | 1.7 | 10 | Available |
| PbSn$^{0.5}$Ag$^3$Ni$^5$ | ○ | ○ | 6.3 | 2.0 | 11 | Available |
| PbSn$^1$Ag$^3$Ni$^{0.1}$ | ○ | ○ | 12.5 | 1.6 | 9 | Available |
| PbSn$^1$Ag$^3$Ni$^{0.5}$ | ○ | ○ | 6.5 | 1.7 | 9 | Available |
| PbSn$^1$Ag$^3$Ni$^1$ | ○ | ○ | 5.9 | 1.8 | 9 | Available |
| PbSn$^1$Ag$^3$Ni$^2$ | ○ | ○ | 5.9 | 2.0 | 10 | Available |
| PbSn$^1$Ag$^3$Ni$^5$ | ○ | ○ | 5.8 | 2.3 | 11 | Available |
| PbSn$^5$Ag$^2$Ni$^{0.1}$ | ○ | ○ | 6.7 | 4.0 | 10 | Available |
| PbSn$^5$Ag$^5$Ni$^5$ | ○ | ○ | 5.5 | 7.3 | 11 | Available |
| PbSn$^1$Sb$^1$ | ○ | ○ | 9.1 | 1.5 | 10 | Available |
| PbSn$^1$Sb$^3$ | ○ | ○ | 9.5 | 1.5 | 10 | Available |
| PbSn$^1$Sb$^5$ | ○ | ○ | 9.8 | 1.6 | 10 | Available |
| PbSn$^3$Sb$^3$ | ○ | ○ | 8.3 | 2.2 | 10 | Available |
| PbSn$^3$Sb$^5$ | ○ | ○ | 8.6 | 1.9 | 11 | Available |
| PbSn$^5$Sb$^1$ | ○ | ○ | 7.6 | 2.9 | 11 | Available |
| PbSn$^5$Sb$^3$ | ○ | ○ | 7.8 | 2.9 | 11 | Available |
| PbSn$^5$Sb$^5$ | ○ | ○ | 8.2 | 2.7 | 11 | Available |
| PbSn$^{10}$Sb$^3$ | ○ | ○ | 6.4 | 3.6 | 12 | Available |
| PbSn$^{10}$Sb$^5$ | ○ | ○ | 6.8 | 3.7 | 12 | Available |
| PbSn$^{30}$Sb$^5$ | ○ | ○ | 6.3 | 4.9 | 14 | Available |
| PbSn$^{30}$Sb$^8$ | ○ | ○ | 6.5 | 4.8 | 14 | Available |
| PbSn$^{50}$Sb$^5$ | ○ | ○ | 6.1 | 5.6 | 15 | Available |
| PbSn$^{50}$Sb$^8$ | ○ | ○ | 6.6 | 5.8 | 15 | Available |
| PbSn$^1$Sb$^1$Ag$^2$ | ○ | ○ | 9.4 | 1.6 | 10 | Available |
| PbSn$^1$Sb$^5$Ag$^3$ | ○ | ○ | 10.0 | 1.5 | 10 | Available |
| PbSn$^1$Sb$^8$Ag$^{10}$ | ○ | ○ | 10.5 | 1.5 | 11 | Available |
| PbSn$^3$Sb$^5$Ag$^3$ | ○ | ○ | 9.0 | 1.8 | 10 | Available |
| PbSn$^5$Sb$^5$Ag$^3$ | ○ | ○ | 8.1 | 2.5 | 11 | Available |
| PbSn$^{10}$Sb$^5$Ag$^3$ | ○ | ○ | 6.8 | 3.5 | 12 | Available |
| PbSn$^{30}$Sb$^5$Ag$^3$ | ○ | ○ | 6.7 | 4.9 | 14 | Available |
| PbSn$^{50}$Sb$^5$Ag$^3$ | ○ | ○ | 6.7 | 6.0 | 15 | Available |
| PbSn$^1$Ag$^2$Cu$^{0.9}$Sb$^1$ | ○ | ○ | 7.3 | 2.8 | 10 | Available |
| PbSn$^1$Ag$^3$Cu$^{0.1}$Sb$^1$ | ○ | ○ | 7.6 | 2.7 | 10 | Available |
| PbSn$^1$Ag$^3$Cu$^{0.1}$Sb$^3$ | ○ | ○ | 8.5 | 2.5 | 10 | Available |
| PbSn$^1$Ag$^3$Cu$^{0.1}$Sb$^5$ | ○ | ○ | 8.8 | 2.7 | 11 | Available |
| PbSn$^1$Ag$^3$Cu$^{0.1}$Sb$^8$ | ○ | ○ | 9.1 | 2.8 | 12 | Available |
| PbSn$^1$Ag$^{10}$Cu$^{0.9}$Sb$^8$ | ○ | ○ | 9.5 | 2.5 | 13 | Available |
| PbSn$^3$Ag$^3$Cu$^{0.1}$Sb$^1$ | ○ | ○ | 6.6 | 2.1 | 10 | Available |
| PbSn$^3$Ag$^3$Cu$^{0.1}$Sb$^3$ | ○ | ○ | 8.1 | 2.3 | 11 | Available |
| PbSn$^3$Ag$^3$Cu$^{0.1}$Sb$^5$ | ○ | ○ | 8.3 | 3.2 | 11 | Available |
| PbSn$^3$Ag$^3$Cu$^{0.1}$Sb$^8$ | ○ | ○ | 8.6 | 3.4 | 12 | Available |
| PbSn$^5$Ag$^3$Cu$^{0.1}$Sb$^1$ | ○ | ○ | 7.1 | 3.0 | 11 | Available |
| PbSn$^5$Ag$^3$Cu$^{0.1}$Sb$^3$ | ○ | ○ | 7.7 | 3.9 | 11 | Available |
| PbSn$^5$Ag$^3$Cu$^{0.1}$Sb$^5$ | ○ | ○ | 8.0 | 4.0 | 12 | Available |
| PbSn$^5$Ag$^3$Cu$^{0.1}$Sb$^8$ | ○ | ○ | 8.4 | 4.2 | 12 | Available |
| PbSn$^{10}$Ag$^3$Cu$^{0.1}$Sb$^5$ | ○ | ○ | 6.5 | 4.9 | 12 | Available |
| PbSn$^{30}$Ag$^2$Cu$^{0.9}$Sb$^1$ | ○ | ○ | 6.0 | 6.0 | 14 | Available |
| PbSn$^{30}$Ag$^3$Cu$^{0.1}$Sb$^5$ | ○ | ○ | 6.4 | 5.5 | 14 | Available |
| PbSn$^{30}$Ag$^{10}$Cu$^{0.9}$Sb$^8$ | ○ | ○ | 7.0 | 5.3 | 15 | Available |
| PbIn$^5$Au$^{0.1}$ | ○ | ○ | 6.1 | 2.0 | 10 | Available |
| PbIn$^5$Au$^1$ | ○ | ○ | 6.5 | 1.6 | 10 | Available |
| PbIn$^5$Au$^2$ | ○ | ○ | 6.9 | 1.5 | 10 | Available |
| PbIn$^5$Au$^5$ | ○ | ○ | 7.4 | 1.6 | 10 | Available |
| PbIn$^{10}$Au$^{0.1}$ | ○ | ○ | 6.5 | 2.0 | 10 | Available |
| PbIn$^{10}$Au$^1$ | ○ | ○ | 7.0 | 1.8 | 10 | Available |
| PbIn$^{10}$Au$^2$ | ○ | ○ | 7.3 | 1.7 | 11 | Available |
| PbIn$^{10}$Au$^5$ | ○ | ○ | 7.6 | 1.5 | 11 | Available |
| PbIn$^{12}$Au$^4$ | ○ | ○ | 7.8 | 1.4 | 11 | Available |
| PbIn$^{30}$Au$^5$ | ○ | ○ | 8.0 | 1.5 | 13 | Available |
| PbIn$^{50}$Au$^5$ | ○ | ○ | 8.5 | 3.0 | 15 | Available |

TABLE-continued

| Kind of Test Piece (wt. %) | Workability | Ball Forming Characteristic | Tensile Strength (kg/mm²) | Elongation (%) | Ball Hardness (Hv) | Cutting at the Root of Ball |
|---|---|---|---|---|---|---|
| $PbIn^5Ag^{0.1}$ | O | O | 5.8 | 2.0 | 10 | Available |
| $PbIn^5Ag^1$ | O | O | 6.3 | 1.7 | 10 | Available |
| $PbIn^5Ag^2$ | O | O | 6.5 | 1.6 | 10 | Available |
| $PbIn^5Ag^5$ | O | O | 6.9 | 1.5 | 10 | Available |
| $PbIn^{10}Ag^{0.1}$ | O | O | 6.1 | 1.9 | 10 | Available |
| $PbIn^{10}Ag^1$ | O | O | 6.6 | 2.0 | 11 | Available |
| $PbIn^{10}Ag^2$ | O | O | 6.9 | 2.0 | 11 | Available |
| $PbIn^{10}Ag^5$ | O | O | 7.2 | 1.9 | 11 | Available |
| $PbIn^{30}Ag^5$ | O | O | 7.5 | 2.1 | 13 | Available |
| $PbIn^{50}Ag^5$ | O | O | 8.0 | 3.0 | 15 | Available |
| $PbIn^5Cu^{0.1}$ | O | O | 5.5 | 2.0 | 10 | Available |
| $PbIn^5Cu^1$ | O | O | 6.0 | 1.9 | 10 | Available |
| $PbIn^5Cu^2$ | O | O | 6.4 | 1.5 | 10 | Available |
| $PbIn^5Cu^5$ | O | O | 7.0 | 1.6 | 10 | Available |
| $PbIn^{10}Cu^{0.1}$ | O | O | 5.9 | 1.9 | 10 | Available |
| $PbIn^{10}Cu^1$ | O | O | 6.4 | 1.8 | 11 | Available |
| $PbIn^{10}Cu^2$ | O | O | 6.8 | 1.8 | 11 | Available |
| $PbIn^{10}Cu^5$ | O | O | 7.5 | 1.7 | 11 | Available |
| $PbIn^{30}Cu^5$ | O | O | 8.3 | 2.0 | 13 | Available |
| $PbIn^{50}Cu^5$ | O | O | 8.9 | 2.2 | 15 | Available |
| $SnSb^1Au^1Ag^3$ | O | O | 9.5 | 1.0 | 10 | Available |
| $SnSb^2Au^1Ag^3$ | O | O | 8.1 | 2.5 | 11 | Available |
| $SnSb^3Au^1Ag^3$ | O | O | 7.0 | 5.0 | 11 | Available |
| $SnPb^1Au^1Ag^3$ | O | O | 9.0 | 1.0 | 10 | Available |
| $SnPb^2Au^1Ag^3$ | O | O | 7.8 | 2.0 | 10 | Available |
| $SnPb^3Au^1Ag^3$ | O | O | 6.9 | 5.1 | 11 | Available |
| $SnSb^1Pb^{35}$ | O | O | 10.1 | 1.1 | 12 | Available |
| $SnSb^8Pb^{35}$ | O | O | 8.1 | 2.6 | 16 | Available |
| $SnSb^1Pb^{40}$ | O | O | 10.0 | 1.0 | 12 | Available |
| $SnSb^5Pb^{40}$ | O | O | 9.1 | 1.5 | 14 | Available |
| $SnSb^8Pb^{40}$ | O | O | 8.2 | 2.5 | 16 | Available |
| $SnSb^1Pb^{35}Ag^2$ | O | O | 10.0 | 1.3 | 12 | Available |
| $SnSb^1Pb^{40}Ag^5$ | O | O | 11.3 | 1.0 | 13 | Available |
| $SnSb^5Pb^{40}Ag^5$ | O | O | 9.5 | 1.6 | 15 | Available |
| $SnSb^8Pb^{35}Ag^{10}$ | O | O | 8.9 | 2.0 | 17 | Available |
| $SnSb^8Pb^{40}Ag^5$ | O | O | 8.7 | 2.0 | 17 | Available |
| $SnSb^1Pb^{35}Ag^2Cu^{0.9}$ | O | O | 11.0 | 1.0 | 12 | Available |
| $SnSb^8Pb^{35}Ag^{10}Cu^{0.9}$ | O | O | 8.0 | 3.6 | 18 | Available |
| $SnSb^1Pb^{40}Ag^2Cu^{0.1}$ | O | O | 11.5 | 1.0 | 12 | Available |
| $SnSb^1Pb^{40}Ag^5Cu^{0.1}$ | O | O | 11.0 | 1.0 | 13 | Available |
| $SnSb^1Pb^{40}Ag^{10}Cu^{0.1}$ | O | O | 10.2 | 3.5 | 15 | Available |
| $SnSb^5Pb^{40}Ag^2Cu^{0.1}$ | O | O | 9.8 | 1.5 | 14 | Available |
| $SnSb^5Pb^{40}Ag^5Cu^{0.1}$ | O | O | 9.3 | 2.0 | 15 | Available |
| $SnSb^5Pb^{40}Ag^{10}Cu^{0.1}$ | O | O | 8.7 | 4.0 | 16 | Available |
| $SnSb^8Pb^{40}Ag^2Cu^{0.1}$ | O | O | 9.2 | 2.1 | 15 | Available |
| $SnSb^8Pb^{40}Ag^5Cu^{0.1}$ | O | O | 8.5 | 3.0 | 17 | Available |
| $SnSb^8Pb^{40}Ag^{10}Cu^{0.1}$ | O | O | 8.2 | 4.5 | 18 | Available |
| $SnPb^{35}Ag^2Cu^{0.1}$ | O | O | 7.3 | 3.0 | 10 | Available |
| $SnPb^{35}Ag^5Cu^{0.1}$ | O | O | 7.5 | 4.0 | 11 | Available |
| $SnPb^{35}Ag^{10}Cu^{0.1}$ | O | O | 7.8 | 5.0 | 12 | Available |
| $InSn^1Au^1Ag^2$ | O | O | 4.3 | 15 | 2 | Available |
| $InSn^2Au^1Ag^2$ | O | O | 3.0 | 11 | 3 | Available |
| $InPb^1Au^1Ag^2$ | O | O | 4.3 | 17 | 2 | Available |
| $InPb^2Au^1Ag^2$ | O | O | 2.7 | 13 | 3 | Available |
| $InPb^1Cu^1Ag^2$ | O | O | 4.4 | 15 | 2 | Available |
| $InPb^2Cu^1Ag^2$ | O | O | 3.1 | 13 | 3 | Available |
| $PbSn^2Au^{0.001}Sb^{0.01}Cu^{0.01}$ | O | O | 4.5 | 2.0 | 9 | Available |
| $PbSn^2Au^{0.01}Sb^{0.5}Cu^{0.1}$ | O | O | 4.7 | 2.0 | 9 | Available |
| $PbSn^2Au^{0.02}Sb^{0.5}Cu^{0.1}$ | O | O | 4.7 | 1.8 | 9 | Available |
| $PbSn^2Au^{0.5}Sb^5Cu^{1.5}$ | O | O | 9.0 | 1.5 | 12 | Available |
| $PbSn^5Au^{0.001}Sb^{0.01}Cu^{0.01}$ | O | O | 4.4 | 3.0 | 9 | Available |
| $PbSn^5Au^{0.01}Sb^{0.5}Cu^{0.1}$ | O | O | 4.5 | 3.0 | 9 | Available |
| $PbSn^5Au^{0.02}Sb^{0.5}Cu^{0.1}$ | O | O | 4.5 | 2.9 | 9 | Available |
| $PbSn^5Au^{0.5}Sb^5Cu^{1.5}$ | O | O | 8.0 | 2.4 | 12 | Available |
| $SnPb^{40}Au^{0.001}Sb^{0.01}Cu^{0.01}$ | O | O | 7.2 | 2.2 | 12 | Available |
| $SnPb^{40}Au^{0.01}Sb^{0.5}Cu^{0.1}$ | O | O | 7.3 | 2.2 | 12 | Available |
| $SnPb^{40}Au^{0.02}Sb^{0.5}Cu^{0.1}$ | O | O | 7.3 | 2.2 | 12 | Available |
| $SnPb^{40}Au^{0.5}Sb^5Cu^{1.5}$ | O | O | 9.0 | 2.0 | 14 | Available |

| Kind of Test Piece (wt. %) | Comparison Product | | | | | |
|---|---|---|---|---|---|---|
| | Workability | Ball Forming Characteristic | Tensile Strength (kg/mm²) | Elongation (%) | Ball Hardness (Hv) | Cutting at the Root of Ball |
| $PbSn^{10}Cu^{0.9}$ | X | O | 2.4 | 40 | 10 | Not Available |
| $PbAg^3Cu^{0.9}$ | O | O | 3.0 | 38 | 9 | Not Available |
| $PbSn^{0.3}Ag^3Cu^{0.9}$ | O | O | 3.1 | 37 | 9 | Not Available |
| $PbSn^{0.5}Ag^3Cu^{0.9}$ | O | O | 3.1 | 37 | 9 | Not Available |

TABLE-continued

| | | | | | | |
|---|---|---|---|---|---|---|
| PbSn$^{0.7}$Ag$^3$Cu$^{0.9}$ | O | O | 3.2 | 36 | 9 | Not Available |
| PbSn$^1$Ag$^3$Cu$^{0.9}$ | O | O | 3.3 | 35 | 9 | Not Available |
| PbSn$^2$Ag$^3$Cu$^{0.9}$ | O | O | 3.7 | 32 | 9 | Not Available |
| PbSn$^5$Ag$^3$Cu$^{0.9}$ | O | O | 4.0 | 30 | 10 | Not Available |
| PbSn$^{0.5}$Ag$^{0.5}$Cu$^{0.9}$ | X | O | 2.5 | 39 | 9 | Not Available |
| PbSn$^{0.5}$Ag$^1$Cu$^{0.9}$ | X | O | 2.8 | 38 | 9 | Not Available |
| PbSn$^{0.5}$Ag$^2$Cu$^{0.9}$ | O | O | 3.1 | 35 | 9 | Not Available |
| PbSn$^{0.5}$Ag$^4$Cu$^{0.9}$ | O | O | 3.2 | 36 | 9 | Not Available |
| PbSn$^{0.5}$Ag$^5$Cu$^{0.9}$ | O | O | 3.3 | 36 | 10 | Not Available |
| PbSn$^1$Ag$^{0.5}$Cu$^{0.9}$ | X | O | 2.3 | 40 | 9 | Not Available |
| PbSn$^1$Ag$^1$Cu$^{0.9}$ | X | O | 2.7 | 39 | 9 | Not Available |
| PbSn$^1$Ag$^2$Cu$^{0.9}$ | O | O | 3.1 | 35 | 9 | Not Available |
| PbSn$^1$Ag$^4$Cu$^{0.9}$ | O | O | 3.2 | 36 | 9 | Not Available |
| PbSn$^1$Ag$^5$Cu$^{0.9}$ | O | O | 3.3 | 36 | 10 | Not Available |
| PbSn$^{0.5}$Ag$^3$Cu$^{0.1}$ | O | O | 3.1 | 35 | 9 | Not Available |
| PbSn$^{0.5}$Ag$^3$Cu$^{0.2}$ | O | O | 3.1 | 35 | 9 | Not Available |
| PbSn$^{0.5}$Ag$^3$Cu$^{0.4}$ | O | O | 3.1 | 34 | 9 | Not Available |
| PbSn$^1$Ag$^3$Cu$^{0.1}$ | O | O | 3.2 | 35 | 9 | Not Available |
| PbSn$^1$Ag$^3$Cu$^{0.2}$ | O | O | 3.2 | 35 | 9 | Not Available |
| PbSn$^1$Ag$^3$Cu$^{0.4}$ | O | O | 3.2 | 34 | 9 | Not Available |
| PbSn$^{0.5}$Cr$^3$Cu$^{0.9}$ | O | O | 3.0 | 37 | 9 | Not Available |
| PbSn$^{0.7}$Cr$^3$Cu$^{0.9}$ | O | O | 3.1 | 37 | 9 | Not Available |
| PbSn$^1$Cr$^3$Cu$^{0.9}$ | O | O | 3.2 | 36 | 9 | Not Available |
| PbSn$^2$Cr$^3$Cu$^{0.9}$ | O | O | 3.6 | 32 | 9 | Not Available |
| PbSn$^{0.5}$Ag$^3$Ni$^{0.1}$ | O | O | 3.1 | 35 | 9 | Not Available |
| PbSn$^{0.5}$Ag$^3$Ni$^{0.5}$ | O | O | 3.3 | 34 | 9 | Not Available |
| PbSn$^{0.5}$Ag$^3$Ni$^1$ | O | O | 3.5 | 33 | 9 | Not Available |
| PbSn$^{0.5}$Ag$^3$Ni$^2$ | O | O | 4.3 | 33 | 10 | Not Available |
| PbSn$^{0.5}$Ag$^3$Ni$^5$ | O | O | 5.0 | 32 | 11 | Not Available |
| PbSn$^1$Ag$^3$Ni$^{0.1}$ | O | O | 3.2 | 35 | 9 | Not Available |
| PbSn$^1$Ag$^3$Ni$^{0.5}$ | O | O | 3.4 | 34 | 9 | Not Available |
| PbSn$^1$Ag$^3$Ni$^1$ | O | O | 3.6 | 33 | 9 | Not Available |
| PbSn$^1$Ag$^3$Ni$^2$ | O | O | 4.5 | 33 | 10 | Not Available |
| PbSn$^1$Ag$^3$Ni$^5$ | O | O | 4.9 | 32 | 11 | Not Available |
| PbSn$^5$Ag$^2$Ni$^{0.1}$ | O | O | 4.2 | 34 | 10 | Not Available |
| PbSn$^5$Ag$^5$Ni$^5$ | O | O | 5.0 | 30 | 10 | Not Available |
| PbSn$^1$Sb$^1$ | O | O | 3.0 | 22 | 10 | Not Available |
| PbSn$^1$Sb$^3$ | O | O | 3.5 | 20 | 10 | Not Available |
| PbSn$^1$Sb$^5$ | O | O | 3.7 | 19 | 10 | Not Available |
| PbSn$^3$Sb$^3$ | O | O | 3.8 | 18 | 10 | Not Available |
| PbSn$^3$Sb$^5$ | O | O | 4.0 | 17 | 11 | Not Available |
| PbSn$^5$Sb$^1$ | O | O | 3.5 | 15 | 11 | Not Available |
| PbSn$^5$Sb$^3$ | O | O | 4.1 | 14 | 11 | Not Available |
| PbSn$^5$Sb$^5$ | O | O | 4.2 | 13 | 11 | Not Available |
| PbSn$^{10}$Sb$^3$ | O | O | 4.7 | 16 | 12 | Not Available |
| PbSn$^{10}$Sb$^5$ | O | O | 4.8 | 15 | 12 | Not Available |
| PbSn$^{30}$Sb$^5$ | O | O | 4.9 | 20 | 14 | Not Available |
| PbSn$^{30}$Sb$^8$ | O | O | 5.0 | 19 | 14 | Not Available |
| PbSn$^{50}$Sb$^5$ | O | O | 5.3 | 30 | 15 | Not Available |
| PbSn$^{50}$Sb$^8$ | O | O | 5.4 | 28 | 15 | Not Available |
| PbSn$^1$Sb$^1$Ag$^2$ | O | O | 3.2 | 21 | 10 | Not Available |
| PbSn$^1$Sb$^5$Ag$^3$ | O | O | 3.8 | 21 | 10 | Not Available |
| PbSn$^1$Sb$^8$Ag$^{10}$ | O | O | 4.2 | 18 | 11 | Not Available |
| PbSn$^3$Sb$^5$Ag$^3$ | O | O | 4.0 | 20 | 10 | Not Available |
| PbSn$^5$Sb$^5$Ag$^3$ | O | O | 4.2 | 20 | 11 | Not Available |
| PbSn$^{10}$Sb$^5$Ag$^3$ | O | O | 4.7 | 18 | 12 | Not Available |
| PbSn$^{30}$Sb$^5$Ag$^3$ | O | O | 5.0 | 20 | 14 | Not Available |
| PbSn$^{50}$Sb$^5$Ag$^3$ | O | O | 5.4 | 30 | 15 | Not Available |
| PbSn$^1$Ag$^2$Cu$^{0.9}$Sb$^1$ | O | O | 3.3 | 23 | 10 | Not Available |
| PbSn$^1$Ag$^3$Cu$^{0.1}$Sb$^1$ | O | O | 3.5 | 21 | 10 | Not Available |
| PbSn$^1$Ag$^3$Cu$^{0.1}$Sb$^3$ | O | O | 3.6 | 20 | 10 | Not Available |
| PbSn$^1$Ag$^3$Cu$^{0.1}$Sb$^5$ | O | O | 3.8 | 20 | 11 | Not Available |
| PbSn$^1$Ag$^3$Cu$^{0.1}$Sb$^8$ | O | O | 3.9 | 19 | 12 | Not Available |
| PbSn$^1$Ag$^{10}$Cu$^{0.9}$Sb$^8$ | O | O | 4.2 | 19 | 13 | Not Available |
| PbSn$^3$Ag$^3$Cu$^{0.1}$Sb$^1$ | O | O | 3.8 | 22 | 10 | Not Available |
| PbSn$^3$Ag$^3$Cu$^{0.1}$Sb$^3$ | O | O | 3.9 | 22 | 11 | Not Available |
| PbSn$^3$Ag$^3$Cu$^{0.1}$Sb$^5$ | O | O | 4.0 | 20 | 11 | Not Available |
| PbSn$^3$Ag$^3$Cu$^{0.1}$Sb$^8$ | O | O | 4.2 | 19 | 12 | Not Available |
| PbSn$^5$Ag$^3$Cu$^{0.1}$Sb$^1$ | O | O | 3.9 | 22 | 11 | Not Available |
| PbSn$^5$Ag$^3$Cu$^{0.1}$Sb$^3$ | O | O | 4.1 | 21 | 11 | Not Available |
| PbSn$^5$Ag$^3$Cu$^{0.1}$Sb$^5$ | O | O | 4.2 | 20 | 12 | Not Available |
| PbSn$^5$Ag$^3$Cu$^{0.1}$Sb$^8$ | O | O | 4.4 | 19 | 12 | Not Available |
| PbSn$^{10}$Ag$^3$Cu$^{0.1}$Sb$^5$ | O | O | 4.7 | 19 | 12 | Not Available |
| PbSn$^{30}$Ag$^2$Cu$^{0.9}$Sb$^1$ | O | O | 4.8 | 20 | 14 | Not Available |
| PbSn$^{30}$Ag$^3$Cu$^{0.1}$Sb$^5$ | O | O | 5.0 | 21 | 14 | Not Available |
| PbSn$^{30}$Ag$^{10}$Cu$^{0.9}$Sb$^8$ | O | O | 5.4 | 21 | 15 | Not Available |
| PbIn$^5$Au$^{0.1}$ | X | O | 2.7 | 51 | 10 | Not Available |
| PbIn$^5$Au$^1$ | O | O | 3.0 | 50 | 10 | Not Available |
| PbIn$^5$Au$^2$ | O | O | 3.3 | 48 | 10 | Not Available |

TABLE-continued

| Composition | | | | | | |
|---|---|---|---|---|---|---|
| PbIn$^5$Au$^5$ | O | O | 3.5 | 48 | 10 | Not Available |
| PbIn$^{10}$Au$^{0.1}$ | O | O | 3.2 | 47 | 10 | Not Available |
| PbIn$^{10}$Au$^1$ | O | O | 3.4 | 46 | 10 | Not Available |
| PbIn$^{10}$Au$^2$ | O | O | 3.5 | 45 | 11 | Not Available |
| PbIn$^{10}$Au$^5$ | O | O | 3.7 | 45 | 11 | Not Available |
| PbIn$^{12}$Au$^4$ | O | O | 3.9 | 41 | 11 | Not Available |
| PbIn$^{30}$Au$^5$ | O | O | 4.9 | 40 | 13 | Not Available |
| PbIn$^{50}$Au$^5$ | O | O | 4.7 | 43 | 15 | Not Available |
| PbIn$^5$Ag$^{0.1}$ | X | O | 2.8 | 50 | 10 | Not Available |
| PbIn$^5$Ag$^1$ | O | O | 3.1 | 49 | 10 | Not Available |
| PbIn$^5$Ag$^2$ | O | O | 3.2 | 48 | 10 | Not Available |
| PbIn$^5$Ag$^5$ | O | O | 3.3 | 47 | 10 | Not Available |
| PbIn$^{10}$Ag$^{0.1}$ | O | O | 3.3 | 45 | 10 | Not Available |
| PbIn$^{10}$Ag$^1$ | O | O | 3.4 | 43 | 11 | Not Available |
| PbIn$^{10}$Ag$^2$ | O | O | 3.6 | 42 | 11 | Not Available |
| PbIn$^{10}$Ag$^5$ | O | O | 3.9 | 41 | 11 | Not Available |
| PbIn$^{30}$Ag$^5$ | O | O | 4.5 | 40 | 13 | Not Available |
| PbIn$^{50}$Ag$^5$ | O | O | 4.1 | 41 | 15 | Not Available |
| PbIn$^5$Cu$^{0.1}$ | X | O | 2.7 | 50 | 10 | Not Available |
| PbIn$^5$Cu$^1$ | O | O | 3.0 | 47 | 10 | Not Available |
| PbIn$^5$Cu$^2$ | O | O | 3.3 | 47 | 10 | Not Available |
| PbIn$^5$Cu$^5$ | O | O | 3.5 | 45 | 10 | Not Available |
| PbIn$^{10}$Cu$^{0.1}$ | O | O | 3.4 | 47 | 10 | Not Available |
| PbIn$^{10}$Cu$^1$ | O | O | 3.6 | 46 | 11 | Not Available |
| PbIn$^{10}$Cu$^2$ | O | O | 3.9 | 44 | 11 | Not Available |
| PbIn$^{10}$Cu$^5$ | O | O | 4.3 | 43 | 11 | Not Available |
| PbIn$^{30}$Cu$^5$ | O | O | 5.1 | 40 | 13 | Not Available |
| PbIn$^{50}$Cu$^5$ | O | O | 4.9 | 41 | 15 | Not Available |
| SnSb$^1$Au$^1$Ag$^3$ | X | O | 2.8 | 40 | 10 | Not Available |
| SnSb$^2$Au$^1$Ag$^3$ | O | O | 3.1 | 35 | 11 | Not Available |
| SnSb$^3$Au$^1$Ag$^3$ | O | O | 4.0 | 30 | 11 | Not Available |
| SnPb$^1$Au$^1$Ag$^3$ | O | O | 3.0 | 39 | 10 | Not Available |
| SnPb$^2$Au$^1$Ag$^3$ | O | O | 3.3 | 34 | 10 | Not Available |
| SnPb$^3$Au$^1$Ag$^3$ | O | O | 4.2 | 29 | 11 | Not Available |
| SnSb$^1$Pb$^{35}$ | O | O | 5.4 | 20 | 12 | Not Available |
| SnSb$^8$Pb$^{35}$ | O | O | 6.6 | 10 | 16 | Not Available |
| SnSb$^1$Pb$^{40}$ | O | O | 5.5 | 20 | 12 | Not Available |
| SnSb$^5$Pb$^{40}$ | O | O | 6.3 | 12 | 14 | Not Available |
| SnSb$^8$Pb$^{40}$ | O | O | 6.7 | 10 | 16 | Not Available |
| SnSb$^1$Pb$^{35}$Ag$^2$ | O | O | 5.2 | 25 | 12 | Not Available |
| SnSb$^1$Pb$^{40}$Ag$^5$ | O | O | 5.6 | 20 | 13 | Not Available |
| SnSb$^5$Pb$^{40}$Ag$^5$ | O | O | 6.4 | 15 | 15 | Not Available |
| SnSb$^8$Pb$^{35}$Ag$^{10}$ | O | O | 7.0 | 13 | 17 | Not Available |
| SnSb$^8$Pb$^{40}$Ag$^5$ | O | O | 6.8 | 13 | 17 | Not Available |
| SnSb$^1$Pb$^{35}$Ag$^2$Cu$^{0.9}$ | O | O | 5.5 | 20 | 12 | Not Available |
| SnSb$^8$Pb$^{35}$Ag$^{10}$Cu$^{0.9}$ | O | O | 6.9 | 13 | 18 | Not Available |
| SnSb$^1$Pb$^{40}$Ag$^2$Cu$^{0.1}$ | O | O | 5.4 | 20 | 12 | Not Available |
| SnSb$^1$Pb$^{40}$Ag$^5$Cu$^{0.1}$ | O | O | 5.6 | 19 | 13 | Not Available |
| SnSb$^1$Pb$^{40}$Ag$^{10}$Cu$^{0.1}$ | O | O | 5.8 | 18 | 15 | Not Available |
| SnSb$^5$Pb$^{40}$Ag$^2$Cu$^{0.1}$ | O | O | 6.2 | 17 | 14 | Not Available |
| SnSb$^5$Pb$^{40}$Ag$^5$Cu$^{0.1}$ | O | O | 6.5 | 15 | 15 | Not Available |
| SnSb$^5$Pb$^{40}$Ag$^{10}$Cu$^{0.1}$ | O | O | 6.7 | 13 | 16 | Not Available |
| SnSb$^8$Pb$^{40}$Ag$^2$Cu$^{0.1}$ | O | O | 6.5 | 16 | 15 | Not Available |
| SnSb$^8$Pb$^{40}$Ag$^5$Cu$^{0.1}$ | O | O | 6.7 | 15 | 17 | Not Available |
| SnSb$^8$Pb$^{40}$Ag$^{10}$Cu$^{0.1}$ | O | O | 6.9 | 13 | 18 | Not Available |
| SnPb$^{35}$Ag$^2$Cu$^{0.1}$ | O | O | 4.5 | 36 | 10 | Not Available |
| SnPb$^{35}$Ag$^5$Cu$^{0.1}$ | O | O | 4.6 | 36 | 11 | Not Available |
| SnPb$^{35}$Ag$^{10}$Cu$^{0.1}$ | O | O | 4.8 | 35 | 12 | Not Available |
| InSn$^1$Au$^1$Ag$^2$ | X | O | 1.3 | 50 | 2 | Not Available |
| InSn$^2$Au$^1$Ag$^2$ | X | O | 1.8 | 46 | 3 | Not Available |
| InPb$^1$Au$^1$Ag$^2$ | X | O | 1.2 | 51 | 2 | Not Available |
| InPb$^2$Au$^1$Ag$^2$ | X | O | 1.4 | 47 | 3 | Not Available |
| InPb$^1$Cu$^1$Ag$^2$ | X | O | 1.3 | 49 | 2 | Not Available |
| InPb$^2$Cu$^1$Ag$^2$ | X | O | 1.6 | 47 | 3 | Not Available |
| PbSn$^2$Au$^{0.001}$Sb$^{0.01}$Cu$^{0.01}$ | X | O | 2.0 | 32 | 9 | Not Available |
| PbSn$^2$Au$^{0.01}$Sb$^{0.5}$Cu$^{0.1}$ | X | O | 2.0 | 31 | 9 | Not Available |
| PbSn$^2$Au$^{0.02}$Sb$^{0.5}$Cu$^{0.1}$ | X | O | 2.0 | 30 | 9 | Not Available |
| PbSn$^2$Au$^{0.5}$Sb$^5$Cu$^{1.5}$ | O | O | 3.7 | 20 | 12 | Not Available |
| PbSn$^5$Au$^{0.001}$Sb$^{0.01}$Cu$^{0.01}$ | X | O | 2.4 | 15 | 9 | Not Available |
| PbSn$^5$Au$^{0.01}$Sb$^{0.5}$Cu$^{0.1}$ | X | O | 2.4 | 15 | 9 | Not Available |
| PbSn$^5$Au$^{0.02}$Sb$^{0.5}$Cu$^{0.1}$ | X | O | 2.5 | 15 | 9 | Not Available |
| PbSn$^5$Au$^{0.5}$Sb$^5$Cu$^{1.5}$ | O | O | 4.3 | 13 | 12 | Not Available |
| SnPb$^{40}$Au$^{0.001}$Sb$^{0.01}$Cu$^{0.01}$ | O | O | 4.4 | 13 | 12 | Not Available |
| SnPb$^{40}$Au$^{0.01}$Sb$^{0.5}$Cu$^{0.1}$ | O | O | 4.5 | 13 | 12 | Not Available |
| SnPb$^{40}$Au$^{0.02}$Sb$^{0.5}$Cu$^{0.1}$ | O | O | 4.5 | 13 | 12 | Not Available |
| SnPb$^{40}$Au$^{0.5}$Sb$^5$Cu$^{1.5}$ | O | O | 6.4 | 12 | 14 | Not Available |

What is claimed is:

1. A fine alloy wire for forming bump electrodes using a wire bonder, said fine wire comprising a Pb alloy comprising Pb-Sn-Cu including 10 wt % of Sn, 0.9 wt % of Cu, and 0.001 wt % to 50 wt % of at least one additional element selected from the group consisting of In, Be, B, C, Mg, Al, Si, P, Ca, Ti, V, Cr, Mn, Fe, Co, Ni, Zn, Ga, Ge, Se, Zr, Nb, Mo, Pd, Ag, Cd, Sb, Te, Ir, Pt, Au, Tl, Bi, and mixtures thereof, and a balance of Pb, and said fine wire is made under a rapid cooling and condensation process having a time of $10^{3\circ}$ to $10^{5\circ}$ C./sec.

2. A fine alloy wire for forming bump electrodes using a wire bonder, said fine wire comprising a Pb alloy comprising Pb-Ag-Cu including 3 wt % of Ag, 0.9 wt % of Cu, and 0.001 wt % to 50 wt % of at least one additional element selected from the group consisting of Sn, In, Be, B, C, Mg, Al, Si, P, Ca, Ti, V, Cr, Mn, Fe, Co, Ni, Zn, Ga, Ge, Se, Zr, Nb, Mo, Pd, Cd, Sb, Te, Ir, Pt, Au, Tl, Bi, and mixtures thereof, and a balance of Pb, and said fine wire is made under a rapid cooling and condensation process having a time of $10^{3\circ}$ to $10^{5\circ}$ C./sec.

3. A fine alloy wire for forming bump electrodes using a wire bonder, said fine wire comprising a Pb alloy comprising Pb-Sn-Ag-Cu including 0.3 to 50 wt % of Sn, 0.5 to 10 wt % of Ag, 0.1 to 0.9 wt % of Cu, and 0.001 wt % to 50 wt % of at least one additional element selected from the group consisting of In, Be, B, C, Mg, Al, Si, P, Ca, Ti, V, Cr, Mn, Fe, Co, Ni, Zn, Ga, Ge, Se, Zr, Nb, Mo, Pd, Cd, Sb, Te, Ir, Pt, Au, Tl, Bi, and mixtures thereof, and a balance of Pb, and said fine wire is made under a rapid cooling and condensation process having a time of $10^{3\circ}$ to $10^{5\circ}$ C./sec.

4. The fine alloy wire according to claim 3, wherein said Pb-Sn-Ag-Cu comprises 0.3 to 5 wt % of Sn, 0.5 to 5 wt % of Ag, 0.1 to 0.9 wt % of Cu, 0.001 wt % to 50 wt % of at least one additional element selected from the group consisting of In, Be, B, C, Mg, Al, Si, P, Ca, Ti, V, Cr, Mn, Fe, Co, Ni, Zn, Ga, Ge, Se, Zr, Nb, Mo, Pd, Cd, Sb, Te, Ir, Pt, Au, Tl, Bi, and mixtures thereof, and a balance of Pb.

5. A fine alloy wire for forming bump electrodes using a wire bonder, said fine wire comprising a Pb alloy comprising Pb-Sn-Cr-Cu including 0.5 to 2 wt % of Sn, 3 wt % of Cr, 0.9 wt % of Cu, and 0.001 wt % to 50 wt % of at least one additional element selected from the group consisting of In, Be, B, C, Mg, Al, Si, P, Ca, Ti, V, Mn, Fe, Co, Ni, Zn, Ga, Ge, Se, Zr, Nb, Mo, Pd, Ag, Cd, Sb, Te, Ir, Pt, Au, Tl, Bi, and mixtures thereof, and a balance of Pb, and said fine wire is made under a rapid cooling and condensation process having a time of $10^{3\circ}$ to $10^{5\circ}$ C./sec.

6. A fine alloy wire for forming bump electrodes using a wire bonder, said fine wire comprising a Pb alloy comprising Pb-Sn-Ag-Ni including 0.5 to 5 wt % of Sn, 2 to 5 wt % of Ag, 0.1 to 5 wt % of Ni, and 0.001 wt % to 50 wt % of at least one additional element selected from the group consisting of In, Be, B, C, Mg, Al, Si, P, Ca, Ti, V, Cr, Mn, Fe, Co, Cu, Zn, Ga, Ge, Se, Zr, Nb, Mo, Pd, Cd, Sb, Te, Ir, Pt, Au, Tl, Bi, and mixtures thereof, and a balance of Pb, and said fine wire is made under a rapid cooling and condensation process having a time of $10^{3\circ}$ to $10^{5\circ}$ C./sec.

7. A fine alloy wire for forming bump electrodes using a wire bonder, said fine wire comprising a Pb alloy comprising Pb-Sn-Sb including 1 to 50 wt % of Sn, 1 to 8 wt % of Sb, and 0.001 wt % to 50 wt % of at least one additional element selected from the group consisting of In, Be, B, C, Mg, Al, Si, P, Ca, Ti, V, Cr, Mn, Fe, Co, Ni, Cu, Zn, Ga, Ge, Se, Zr, Nb, Mo, Pd, Ag, Cd, Te, Ir, Pt, Au, Tl, Bi, and mixtures thereof, and a balance of Pb, and said fine wire is made under a rapid cooling and condensation process having a time of $10^{3\circ}$ to $10^{5\circ}$ C./sec.

8. A fine alloy wire for forming bump electrodes using a wire bonder, said fine wire comprising a Pb alloy comprising Pb-Sn-Sb-Ag including 1 to 50 wt % of Sn, 1 to 8 wt % of Sb, 2 to 10 wt % of Ag, and 0.001 wt % to 50 wt % of at least one additional element selected from the group consisting of In, Be, B, C, Mg, Al, Si, P, Ca, Ti, V, Cr, Mn, Fe, Co, Ni, Cu, Zn, Ga, Ge, Se, Zr, Nb, Mo, Pd, Ag, Cd, Te, Ir, Pt, Au, Tl, Bi, and mixtures thereof, and a balance of Pb, and said fine wire is made under a rapid cooling and condensation process having a time of $10^{3\circ}$ to $10^{5\circ}$ C./sec.

9. The fine alloy wire according to claim 8, wherein said Pb-Sn-Sb-Ag comprises 1 to 5 wt % of Sn, 1 to 8 wt % of Sb, 2 to 5 wt % of Ag, and 0.001 wt % to 50 wt % of at least one additional element selected from the group consisting of In, Be, B, C, Mg, Al, Si, P, Ca, Ti, V, Cr, Mn, Fe, Co, Ni, Cu, Zn, Ga, Ge, Se, Zr, Nb, Mo, Pd, Ag, Cd, Te, Ir, Pt, Au, Tl, Bi, and mixtures thereof, and a balance of Pb.

10. A fine alloy wire for forming bump electrodes using a wire bonder, said fine wire comprising a Pb alloy comprising Pb-Sn-Ag-Cu-Sb including 1 to 50 wt % of Sn, 2 to 10 wt % of Ag, 0.1 to 0.9 wt % of Cu, 1 to 8 wt % of Sb, and 0.001 wt % to 50 wt % of at least one additional element selected from the group consisting of In, Be, B, C, Mg, Al, Si, P, Ca, Ti, V, Cr, Mn, Fe, Co, Ni, Zn, Ga, Ge, Se, Zr, Nb, Mo, Pd, Ag, Cd, Te, Ir, Pt, Au, Tl, Bi, and mixtures thereof, and a balance of Pb, and said fine wire is made under a rapid cooling and condensation process having a time of $10^{3\circ}$ to $10^{5\circ}$ C./sec.

11. The fine alloy wire according to claim 10, wherein said Pb-Sn-Ag-Cu-Sb comprises 1 to 5 wt % Sn, 2 to 5 wt % Ag, 0.1 to 0.9 wt % Cu, 1 to 8 wt % Sb, and 0.001 wt % to 50 wt % of at least one additional element selected from the group consisting of In, Be, B, C, Mg, Al, Si, P, Ca, Ti, V, Cr, Mn, Fe, Co, Ni, Zn, Ga, Ge, Se, Zr, Nb, Mo, Pd, Ag, Cd, Te, Ir, Pt, Au, Tl, Bi, and mixtures thereof, and a balance of Pb.

12. A fine alloy wire for forming bump electrodes using a wire bonder, said fine wire comprising a Pb alloy comprising Pb-Sn-Au-Sb-Cu including 2 to 50 wt % of Sn, 0.001 to 0.5 wt % of Au, 0.01 to 5 wt % of Sb, 0.01 to 1.5 wt % of Cu, and 0.001 wt % to 50 wt % of at least one additional element selected from the group consisting of In, Be, B, C, Mg, Al, Si, P, Ca, Ti, V, Cr, Mn, Fe, Co, Ni, Zn, Ga, Ge, Se, Zr, Nb, Mo, Pd, Ag, Cd, Te, Ir, Pt, Tl, Bi, and mixtures thereof, and a balance of Pb, and said fine wire is made under a rapid cooling and condensation process having a time of $10^{3\circ}$ to $10^{5\circ}$ C./sec.

13. A fine alloy wire for forming bump electrodes using a wire bonder, said fine wire comprising a Pb alloy comprising Pb-In-Au including 5 to 50 wt % of In, 0.1 to 5 wt % of Au, and 0.001 wt % to 50 wt % of at least one additional element selected from the group consisting of Sn, Be, B, C, Mg, Al, Si, P, Ca, Ti, V, Cr, Mn, Fe, Co, Ni, Cu, Zn, Ga, Ge, Se, Zr, Nb, Mo, Pd, Ag, Cd, Sb, Te, Ir, Pt, Tl, Bi, and mixtures thereof, and a balance of Pb, and said fine wire is made under a rapid cooling and condensation process having a time of $10^{3\circ}$ to $10^{5\circ}$ C./sec.

14. A fine alloy wire for forming bump electrodes using a wire bonder, said fine wire comprising a Pb alloy comprising Pb-In-Cu including 5 to 50 wt % of In, 0.1 to 5 wt % of Cu, and 0.001 wt % to 50 wt % of at least one additional element selected from the group consisting of Sn, Be, B, C, Mg, Al, Si, P, Ca, Ti, V, Cr, Mn, Fe, Co, Ni, Cu, Zn, Ga, Ge, Se, Zr, Nb, Mo, Pd, Ag, Cd, Sb, Te, Ir, Pt, Au, Tl, Bi, and mixtures thereof, and a balance of Pb, and said fine wire is made under a rapid cooling and condensation process having a time of $10^{3\circ}$ to $10^{5\circ}$ C./sec.

* * * * *